United States Patent [19]
Kechkaylo

[11] Patent Number: 5,455,543
[45] Date of Patent: Oct. 3, 1995

[54] LOW POWER CONSUMPTION BINARY PHASE SHIFT KEYED (BPSK) MODULATOR USING ABSORPTIVE ELECTRONIC SWITCHING TECHNIQUES

[75] Inventor: David L. Kechkaylo, Solvay, N.Y.

[73] Assignee: Thomson Consumer Electronics, Inc., Indianapolis, Ind.

[21] Appl. No.: 188,640

[22] Filed: Jan. 28, 1994

[51] Int. Cl.⁶ .................. H04K 1/00; H03C 3/00
[52] U.S. Cl. .......... 332/103; 332/105; 332/104; 375/200; 375/308; 375/279
[58] Field of Search .................. 332/103, 104, 332/105; 375/17, 52–55, 67, 83, 86, 87, 279, 280, 281, 282, 308, 329, 332, 333, 200

[56] References Cited

U.S. PATENT DOCUMENTS

| | | | |
|---|---|---|---|
| 3,842,401 | 10/1974 | Smith, Jr. et al. | 375/17 X |
| 4,224,583 | 9/1980 | Larkin | 333/100 |
| 4,276,521 | 6/1981 | Davidheiser | 332/23 R |
| 4,565,980 | 1/1986 | Ashida | 332/16 R |
| 4,940,954 | 7/1990 | Aubert et al. | 332/103 |
| 5,039,959 | 8/1991 | Young | 332/105 |
| 5,081,432 | 1/1992 | Devlin et al. | 332/103 |
| 5,119,396 | 6/1992 | Sanderford, Jr. | 332/103 X |
| 5,311,151 | 5/1994 | Vaisanen | 332/105 |

OTHER PUBLICATIONS

RF Design magazine, Sep. 1993, p. 59, FP–BPM–1047.

*Primary Examiner*—Robert J. Pascal
*Assistant Examiner*—Arnold Kinkead
*Attorney, Agent, or Firm*—Joseph S. Tripoli; Peter M. Emanuel; Thomas F. Lenihan

[57] ABSTRACT

A low power consumption BPSK modulator uses only one center-tapped transformer and a single-pole double-throw (SPDT) switching arrangement including four field effect transistors and a pair of termination resistors. An advantage of the subject invention is that the DC switching current is reduced by a factor of approximately 1500 with respect to a conventional diode ring modulator. An extremely important advantage of the subject invention in the field of handheld battery-powered communications equipment is that the subject apparatus can be made relatively small due to the necessity for only one transformer.

7 Claims, 6 Drawing Sheets

LOW POWER CONSUMPTION BINARY PHASE SHIFT KEYED (BPSK) MODULATOR USING ABSORPTIVE ELECTRONIC SWITCHING TECHNIQUES

FIELD OF THE INVENTION

The subject invention concerns the field of binary phase-shift-keyed (BPSK) modulators in general, and specifically concerns a low power consumption BPSK arrangement.

CROSS REFERENCE TO RELATED APPLICATION

The subject application is concerns similar subject matter to a patent application bearing Ser. No. 08/188,969, filed herewith and assigned to the same assignee as the present application.

BACKGROUND OF THE INVENTION

In a digital transmission system, such as a direct sequence spread spectrum communication system, a biphase shift-keyed modulator (hereinafter BPSK modulator) is used to modulate a radio frequency (RF) transmission carrier with binary information. The BPSK modulator selects for transmission either an in-phase (i.e., 0-degree) or an out-of-phase (i.e., 180-degree phase shifted) representation of the carrier signal, in response to a control signal which usually corresponds to the digital bits (i.e., binary information) to be sent.

The usual apparatus for accomplishing this task involves the use of two center-tapped transmission line transformers and a matched set of four switching diodes. This arrangement is commonly known as a ring modulator. In operation, the ring modulator routes the chosen phase of the carrier signal to the output by forward biasing a selected pair of the switching diodes, causing a DC switching current, and the desired phase of the AC carrier signal, to flow through the selected pair of diodes. A suitable diode array for use in a ring modulator is the SBL-1 ring diode array manufactured by Mini-Circuits, Inc., Brooklyn, N.Y.

It is noted that, in general, a ring modulator performs its signal switching function quite well, but unfortunately, ring modulators have a disadvantage that a relatively large DC switching current (which may be in excess of 20 milliamperes) is required to ensure that the switching diodes are fully turned on.

In a battery-operated digital transceiver, such as handheld direct sequence spread spectrum communications equipment, conservation of battery power is of utmost concern. In this environment, the 20 milliampere DC switching current of conventional ring modulators, mentioned above, is considered an unacceptable drain on the limited battery resources available.

SUMMARY OF THE INVENTION

A low power consumption BPSK modulator comprises a single center-tapped transformer and a switching arrangement including four field effect transistors (FETs). An advantage of the subject invention is that the DC switching current is reduced by a factor of approximately 1500 with respect to a conventional diode ring modulator. A second advantage of the subject invention is that only one center-tapped transformer is required. A third advantage of the subject invention over diode ring modulators is that the carrier signal loss is lower due to the use of only a single transformer, and due to the low on-resistance of the FETs. A fourth extremely important advantage of the subject invention in the field of cordless telephone handsets is that the subject apparatus can be made relatively small due to the necessity for only one transformer.

BRIEF DESCRIPTION OF THE DRAWINGS

FIG. 1b shows waveforms useful in understanding the circuitry of FIG. 1a.

FIGS. 2a and 2b show simplified circuit diagrams useful in understanding the circuitry of FIG. 1a.

DETAILED DESCRIPTION OF THE EMBODIMENT

Figure 1A:
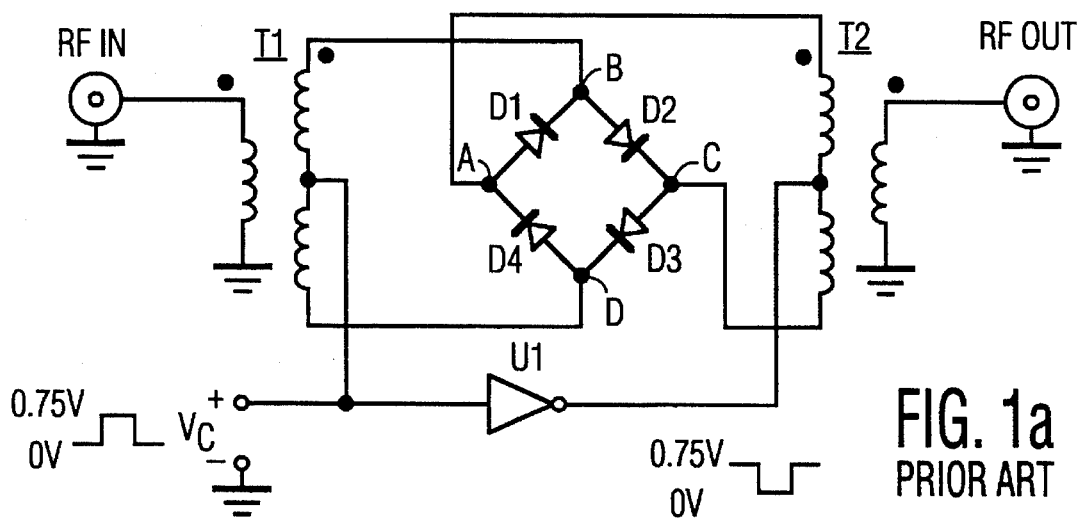
FIG. 1a shows a typical ring modulator as known from the prior art.
Figure 1B:
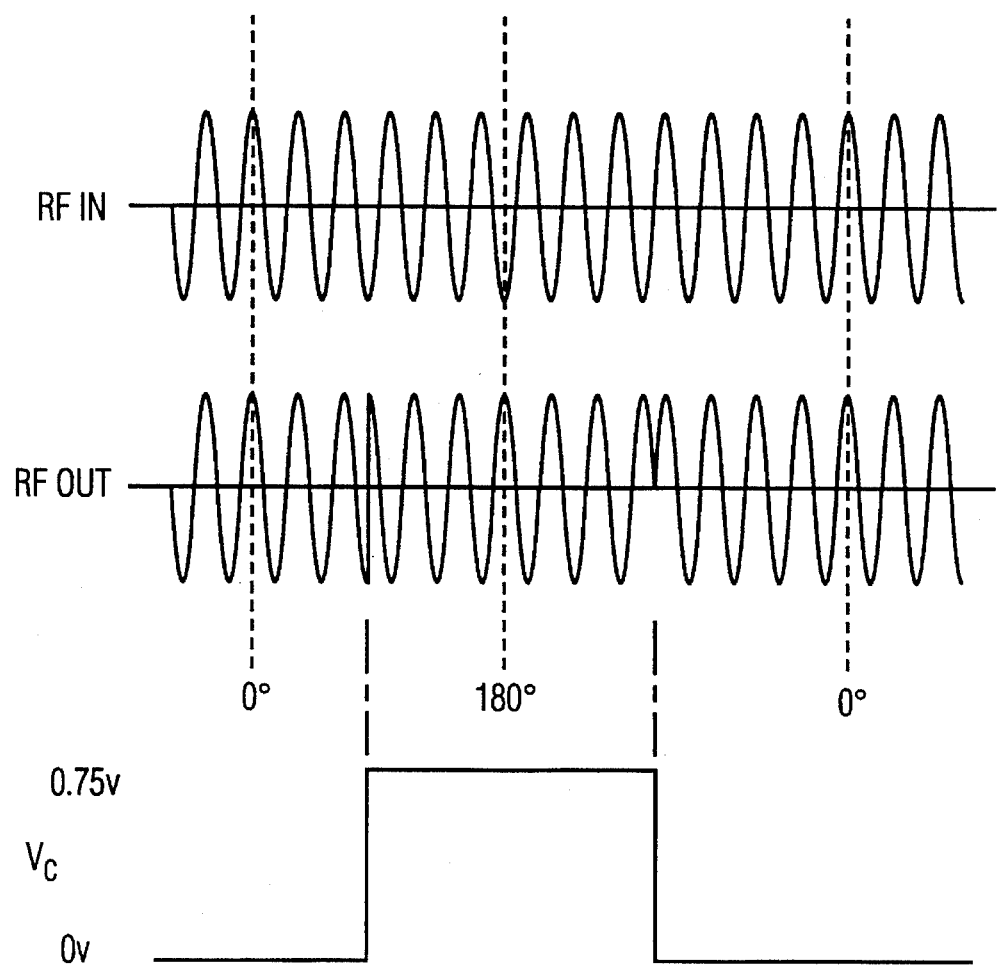
Figure 2A:
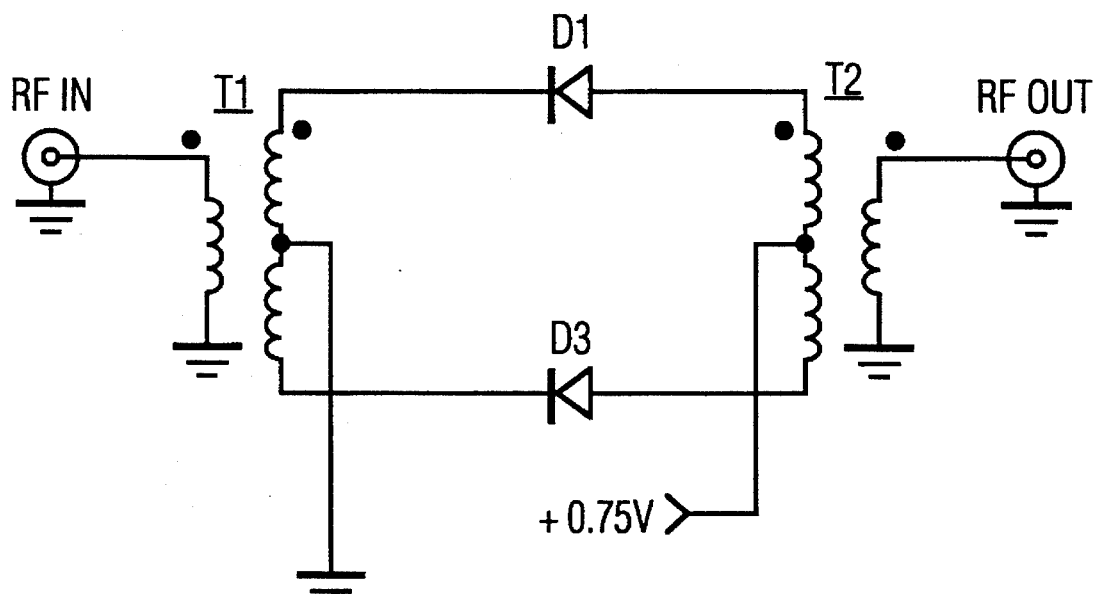
Figure 2B:
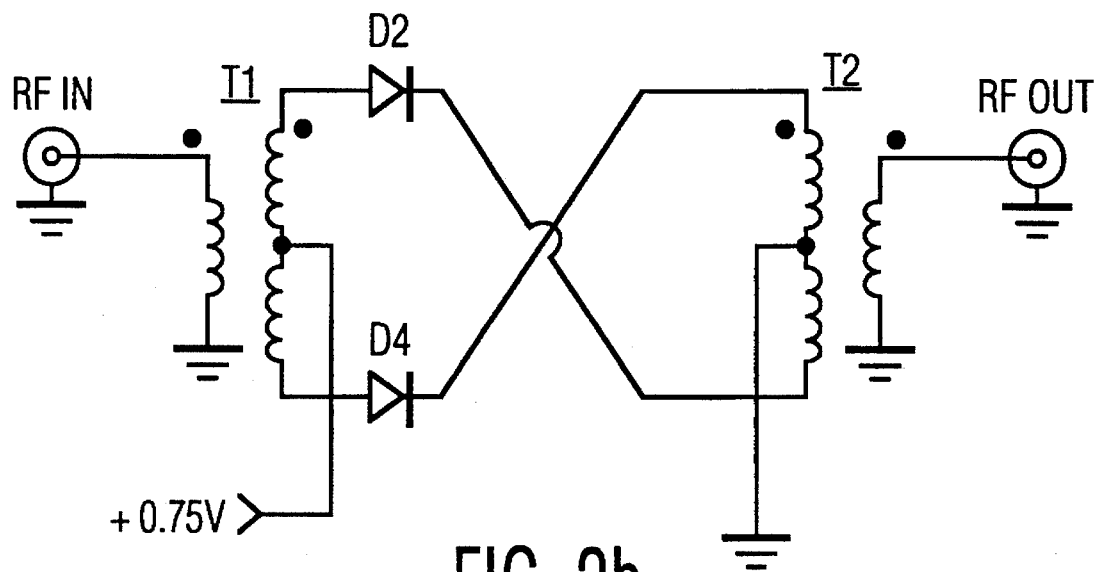

A brief description of prior art ring modulators with reference to FIGS. 1a, 1b, 2a, and 2b may be helpful to provide a background before describing the subject invention. As noted above, the purpose of a ring modulator is to select a phase of an RF carrier in accordance with a digital modulating signal in order to convey the digital information by transmitting the phase-modulated RF carrier signal. A ring modulator as known from the prior art is shown in FIG. 1a. An RF signal is applied to an RF input terminal (RF IN), and either an in-phase or an out-of-phase RF signal is developed at the RF output terminal (RF OUT). In operation, a modulating control signal which changes state between a level of 0 volts and a level of approximately 0.75 volts is applied to the center tap of an input transformer T1 and to the input of an inverting amplifier U1. The output signal of inverting amplifier U1 is coupled to the center tap of an output transformer T2. Assuming for purposes of explanation that the control signal applied to T1 is 0 volts, then diode D3 will be forward biased as will diode D1 (due to the inverted (i.e., high level) control signal applied to the anode of D1 through transformer T2). This will result in a coupling of an in-phase version of the RF carrier signal to the output terminal (RF OUT). FIG. 2a is a simplified circuit diagram showing the above described condition. Referring to FIG. 1b, note that an in-phase signal (with respect to the input RF signal) is developed at the RF output terminal when the control signal ($V_c$) is low When a control signal having 0.75 volt level is applied to the center tap of transformer T1, then diodes D1 and D3 are reverse-biased and diodes D2 and D4 are forward-biased. A simplified circuit illustrating this configuration is shown in FIG. 2b. Thus, during the time in which $V_c$ exhibits a high level, an out-of-phase RF signal is coupled through to the RF output terminal (RF OUT), as shown in FIG. 1b.

Figure 3A:
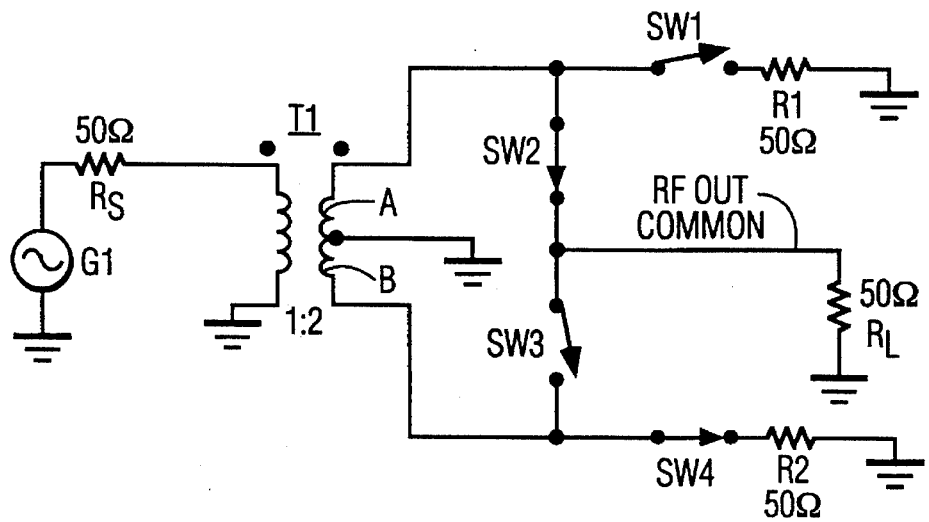
FIGS. 3a–3d show simplified circuit diagrams useful in understanding the subject invention.
Figure 3B:
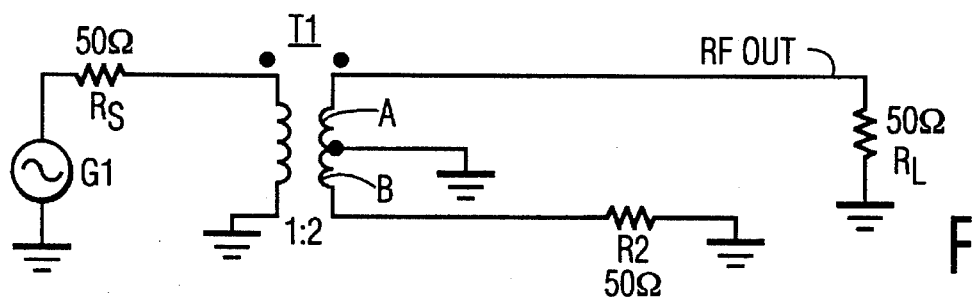
Figure 3C:
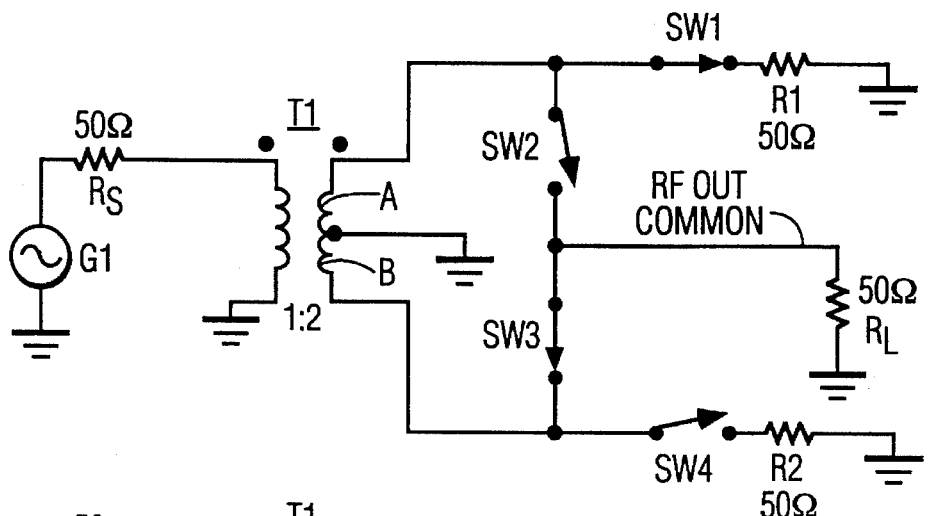
Figure 3D:
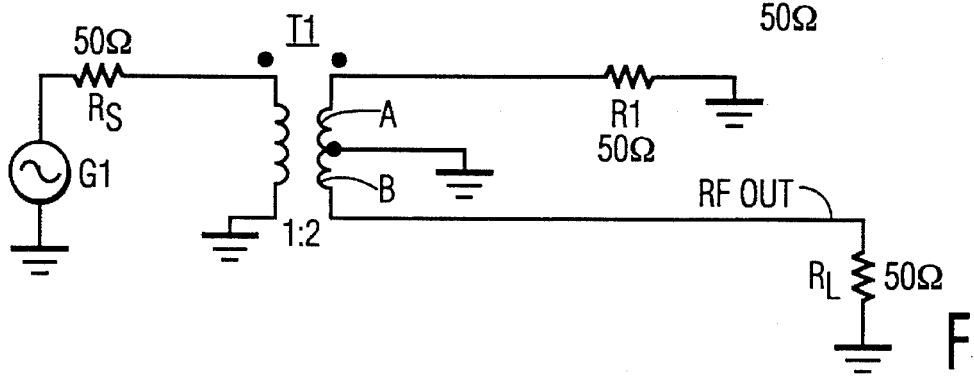

The subject invention will now be described with reference to FIGS. 3a–3d, 4, and 5. A simplified switching circuit, shown in FIG. 3a, illustrates a basic concept of the subject invention. An RF carrier signal is applied to the input winding of a transformer T1 by an RF signal source G1 through a resistance $R_S$. One skilled in the art will recognize that resistance $R_S$ can be the internal source impedance of RF signal source G1. Transformer T1 has a center-tapped secondary winding, and has a turns ratio of approximately 1:2. Recall that the impedance ratio of a transformer is equal to the square of the turns ratio. Thus, the upper winding of the secondary of transformer T1 (between point A and the grounded centertap) exhibits a 50Ω impedance, as does the lower winding of the secondary of T1 (between point B and the grounded centertap ), thereby providing appropriate matching impedance for both halves of the output circuit. Transformer T1 couples the RF signal from its input side to the upper half of its output side without phase inversion (as shown by the phasing dots), and couples the RF signal from its input side to the lower half of its output side with 180-degree phase inversion. Both portions of the secondary side of transformer T1 are coupled to a switch array SW1–SW4 and a load resistance $R_L$. Note that the state of switches SW1–SW4 determine the phase of the RF signal developed across load resistor $R_L$. In FIG. 3a, switches SW1 and SW3 are open, and switches SW2 and SW4 are closed. This causes an RF output signal to be developed across load resistor $R_L$ which is in-phase with the applied RF input signal, and causes the out-of-phase signal to be developed across an internal 50Ω termination resistor R2. A further simplified representation of this circuit configuration is shown in FIG. 3b. In FIG. 3c, switches SW2 and SW4 are open, and switches SW1 and SW3 are closed. This causes an RF output signal to be developed across load resistor $R_L$ which is 180-degrees out-of-phase with the applied RF input signal, and causes the in-phase signal to be developed across another internal 50Ω termination resistor R1. A further simplified representation of this circuit configuration is shown in FIG. 3d.

Figure 4:
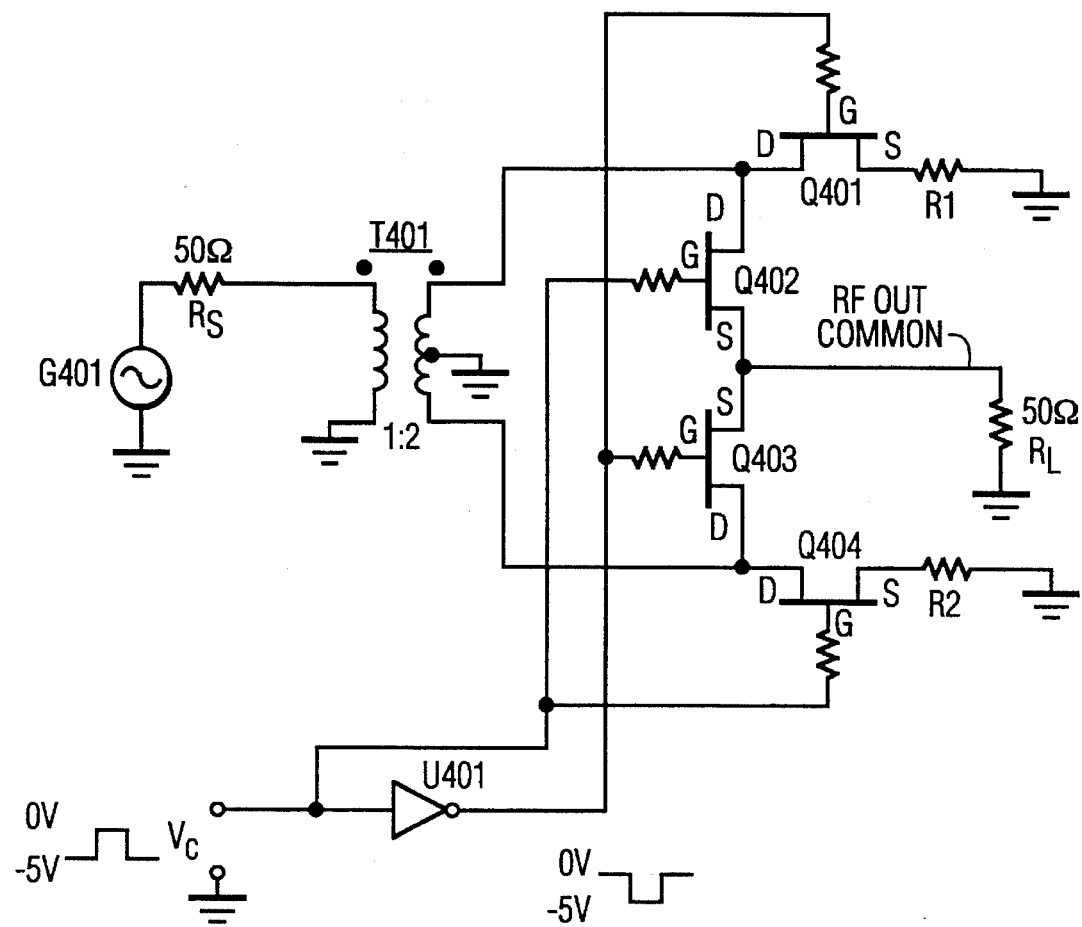
FIG. 4 shows an embodiment of the invention.

A practical version of the above described circuitry, utilizing JFETs as electronic switches, has been built and tested and is shown in FIG. 4. The BPSK modulator of FIG. 4 may use GaAs (Gallium Arsinide) quad JFET switches of a type similar to ANZAC SW-214 or an AVANTEK MGS-71008. These commercially-available RF switches are of the single-pole-double-throw type (SPDT), and as such, have two input ports and a common output port. They also include a second switch arrangement coupled to two built-in termination resistors R1 and R2. These SPDT switches are normally used for selecting one of two RF signals for connection to the common output port, and automatically applying a 50Ω termination resistor to the nonselected input. Such switches are known as "absorptive" switches because connecting the nonselected input port internally to ground through a terminating resistance results in a reflection coefficient (Γ) of 0. The gate resistors shown in FIG. 4 are used to limit the current to the gate p-n junction in the event that forward bias is accidentally applied to the JFETs.

Elements of FIG. 4 bearing the same or similar reference numerals as elements of FIGS. 3a–3d, serve the same function. In operation, an RF carrier signal is applied to a transformer T401 by an RF signal source G401 through a resistance $R_S$. Once again, one skilled in the art will recognize that resistance $R_S$ can be the internal source impedance of RF signal source G401. Transformer T401 of FIG. 4 also has a turns ratio of approximately 1:2 and couples the RF signal from its input side to the upper winding of its output side without phase inversion (as shown by the phasing dots), and to the lower winding of its secondary side with 180-degree phase inversion. Both portions of the output side of transformer T401 are coupled to a GaAs JFET switch array Q401–Q404 and a load resistance $R_L$. Note that the conduction state of JFET switches Q401–Q404 determines the phase of the RF signal developed across load resistor $R_L$. When $V_c$ is low (i.e.,–5v), JFET switches Q402 and Q404 are nonconductive, and JFET switches Q401 and Q403 are conductive due to the high level signal (0v) applied to their gate electrodes by inverter U401. This causes an RF output signal to be developed across load resistor $R_L$ which is 180-degrees out-of-phase with the applied RF input signal, and causes the in-phase signal to be developed across an internal terminating resistor R1. When $V_c$ is high (i.e., 0v), JFET switches Q402 and Q404 are conductive, and JFET switches Q401 and Q403 are nonconductive due to the low level signal applied to their gate electrodes by inverter U401. This causes an RF output signal to be developed across load resistor $R_L$ which is in-phase with the applied RF input signal, and causes the 180-degrees out-of-phase signal to be developed across an internal terminating resistor R2.

The BPSK modulator of FIG. 4 has been demonstrated to be superior to a ring modulator in that it requires a bias current of only 12 microamperes (μa), as opposed to the 20 milliamperes (ma) required by the ring modulator. Thus it operates with a bias current which is 1/1500 of that required by a ring modulator, an extremely important feature for battery-powered equipment such as handheld direct sequence spread spectrum battery-powered communications equipment. Due to the low current drive required, and the fact that only one center-tapped transformer is needed, the entire apparatus can be made very small, another important feature for portable or cellular telephone handset use.

It is also herein noted that for use in a direct sequence spread spectrum communication system, such as a 900 MHz digital cordless telephone system, the control signal applied to the biphase modulator is a combination of a binary representation of the speech to be transmitted and a spreading code. In such a system, the RF signal is the 900 MHz carrier signal and the output is coupled through an RF amplifier to an antenna for transmission.

Figure 5:
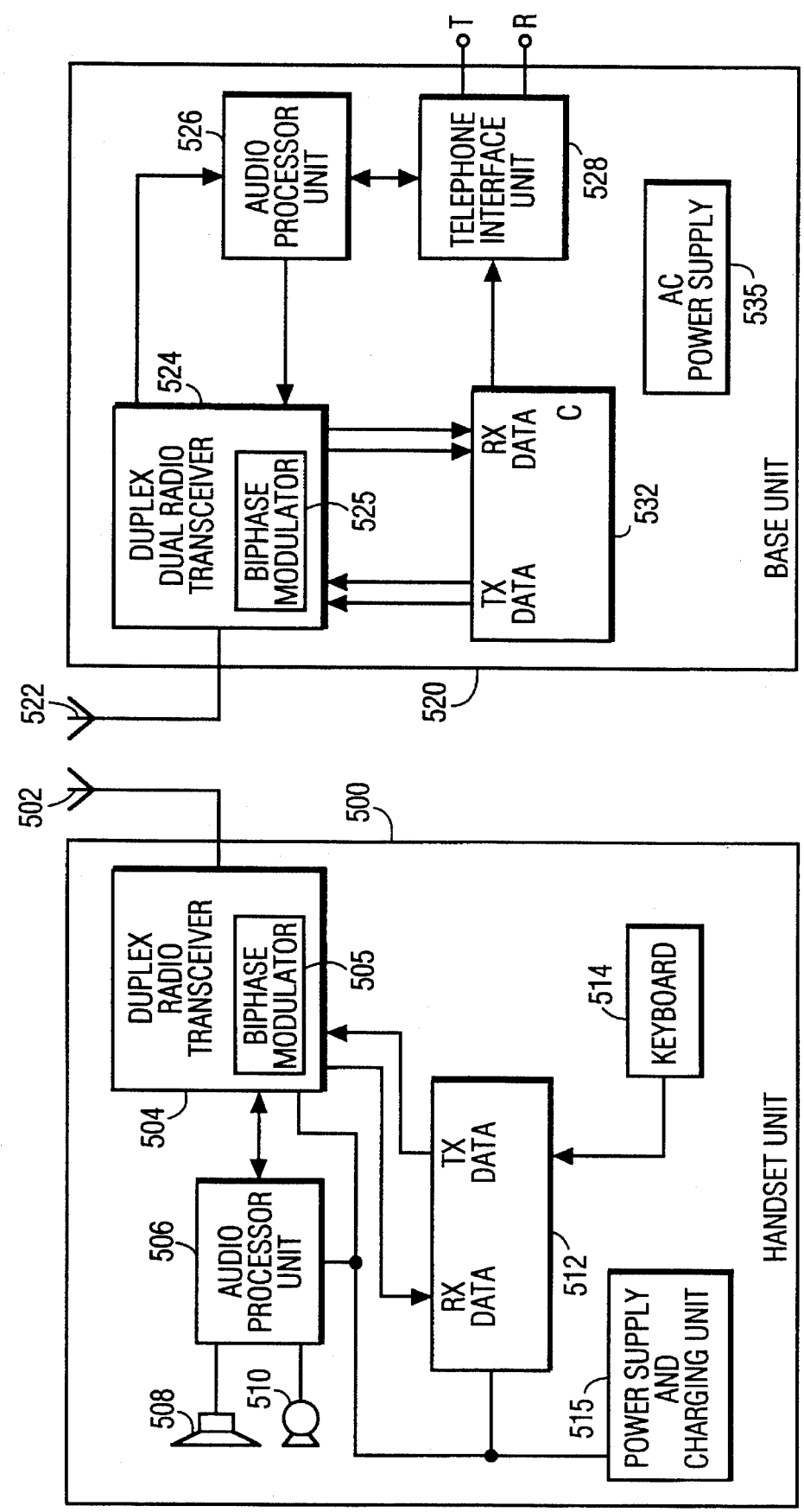
FIG. 5 shows an embodiment of the invention in the environment of a spread spectrum digital cordless telephone system.

FIG. 5 is a simplified illustration of such a cordless spread spectrum digital telephone set comprising a handset unit 500 and a base unit 520, and including the biphase modulator of the invention. Handset unit 500 receives and transmits RF signals via an antenna 502. Antenna 502 is coupled to a duplex radio transceiver unit 504 which is capable of operation in a receiver mode and/or in a transmitter mode. In the receiver mode, transceiver unit 504 applies received and demodulated audio signals to an audio processor unit 505 for amplification and ultimate reproduction in speaker 508. Also in the receiver mode, transceiver 504 also provides digital data to the "receive data" (i.e., Rxdata) terminal of controller 512 In the transmitter mode, transceiver 504 receives audio signals, picked-up (i.e., detected) by microphone 510 and amplified by audio processor unit 506, for transmission to base unit 520. Also in transmitter mode, transceiver 504 receives "transmit data" (i.e., Txdata) from controller 512, for transmission to base unit 520. Transceiver 504 includes a biphase modulator 505 of the type described above. Biphase modulator 505 utilizes a combination of digitized audio data, transmit data and a spreading code, which combination forms the control signal for controlling the phase modulation of the transmitting carrier frequency. Advantageously, as noted above, the FETs of biphase modulator 505 draw only approximately 1/1500 the current drawn by a conventional ring modulator, and thus significantly contribute to extended operating time by reducing battery discharge current. Controller 512 is coupled to a keyboard 514 for receiving keystroke commands from a user. Handunit 500 also includes a power supply and charging unit 515 for supplying operating power to the circuitry of the handunit.

Base unit 520 receives and transmits RF signals via an antenna 522 to remote handunit 500. Antenna 522 is coupled to a duplex dual radio transceiver unit 524 which is capable of operation in a receiver mode and/or in a transmitter mode. In the receiver mode, transceiver unit 524 receives RF signals from remote handunit 500, and applies received and demodulated audio signals to an audio processor unit 526 for amplification and coupling to the telephone system via a telephone interface unit 528. Telephone interface unit 528 is connected to the telephone system via two terminals traditionally known as tip (T) and ring (R). Also in the receiver mode, transceiver 524 also provides digital data to the "receive data" (i.e., Rxdata) terminal of controller 532. Controller 532 has a control terminal C by which telephone interface unit 528 can be controlled to establish communication over the telephone system. In the transmitter mode, transceiver 524 receives audio signals, conveyed by the telephone system via telephone interface unit 528 and amplified by audio processor unit 526, for transmission to handunit 500. Also in transmitter mode, transceiver 524 receives "transmit data" (i.e., Txdata) from controller 532, for transmission to handunit 500. Transceiver 524 includes a biphase modulator 525 of the type described above. Biphase modulator 525 utilizes a combination of digitized audio data, transmit data and a spreading code, which combination forms the control signal for controlling the phase modulation of the transmitting carrier frequency. Base unit 520 also includes an AC power supply unit 535 for supplying operating power to the circuitry of the base unit.

Figure 6:
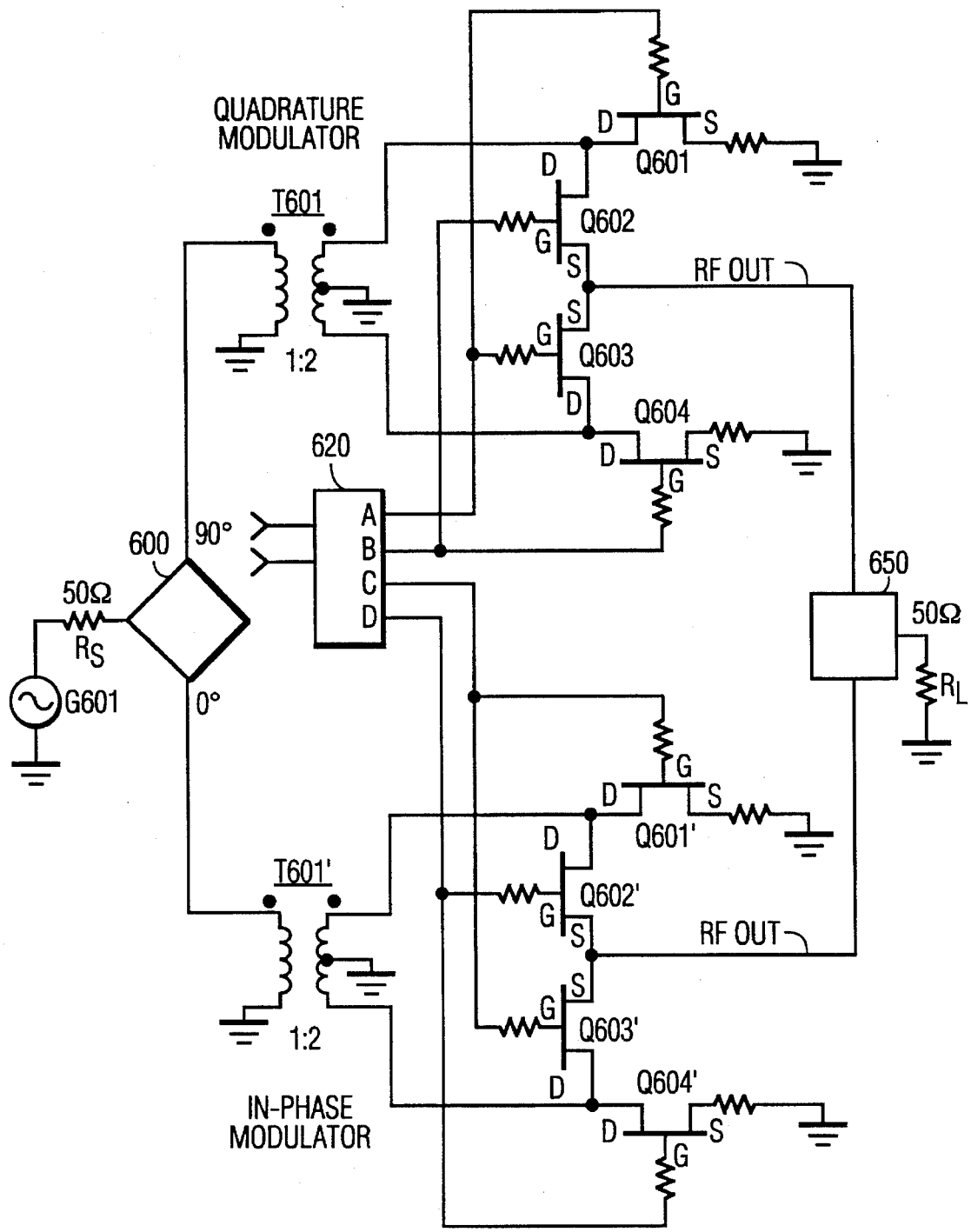
FIG. 6 shows an embodiment of the invention for use as a quadraphase shift-keyed (QPSK) modulator.

A qudraphase shift-keyed (QPSK) modulator utilizing the teaching of the subject invention is shown in FIG. 6. Elements of FIG. 6 bearing the same or similar reference numerals as elements of FIG. 4, serve the same function. In operation, an RF carrier signal is generated by an RF signal source G601 and applied to a quadrature phase network 600 through a resistance $R_S$. Once again, one skilled in the art will recognize that resistance $R_S$ can be the internal source impedance of RF signal source G601. Quadrature phase network 600 has first and second outputs for developing first and second RF signals which are out of phase with each other by 90-degrees. Transformers T601 and T601' of FIG. 6 have turns ratios of approximately 1:2 and couple their respective RF signals from an input side to an output side without phase inversion (as shown by the phasing dots). The output side of transformers T601 and T601' are coupled through respective GaAs JFET switch arrays and a power coupler 650 to a load resistance $R_L$. The conduction state of JFET switches determine the phase of the RF signal developed across load resistor $R_L$. A two to four line decoder 620 develops switching signals A, B, C, and D for controlling the phase selection. Decoder 620 also provides the appropriate voltage shifting required to control the JFET switches. Table 1 shows the selected phase for different control signal conditions.

TABLE 1

| PHASE | A | B | C | D |
|---|---|---|---|---|
| 0° | −5 v | −5 v | −5 v | 0 v |
| 90° | −5 v | 0 v | −5 v | −5 v |
| 180° | −5 v | −5 v | 0 v | −5 v |
| 270° | 0 v | −5 v | −5 v | −5 v |

One skilled in the art will recognize that the QPSK modulator of FIG. 6 is constructed by using a pair of the biphase modulators of FIG. 4. Multi-phase systems beyond quadraphase may also be constructed by using further pairs of biphase modulators, and such systems are contemplated as being within the scope of the present invention.

It is has been found that the JFET switching time required to select between 0 and 180-degrees is very fast, around 5 nanoseconds (ns), which allows for fast modulation speed. Advantageously, all four of the JFETs can be fabricated on a single substrate to provide for close matching of their characteristics. Another advantage of the subject invention over the ring modulator is that the RF signal level handling capability of the ring modulator is a function of the bias current conducted by the diodes. In contrast, the JFET switches of the subject invention are voltage operated devices and, as such, their RF signal level handling capability is not a function of bias current at all.

It is herein recognized that apparatus according to the subject invention exhibits an extremely wide bandpass characteristic and is quite suitable for use from 10 MHz to 1 GHz.

Although reference was made earlier to the use of GaAs JFETs, it is herein recognized that other semiconductor switches may also be used such as insulated gate field effect transistors (IGFETs), or MOFETS.

What is claimed:

1. A low power consumption biphase modulator, comprising:

an input terminal for receiving an input RF signal of a predetermined phase;

an output terminal for developing an RF signal in phase with respect to said input RF signal or substantially 180-degrees out of phase with respect to said input RF signal;

a transformer having a primary winding coupled to said input terminal for receiving said input RF signal, and having a secondary winding including first and second ends and a centertap for developing at opposite ones of said first and second ends said in-phase and out-of-phase RF signals, said centertap being coupled to a point of reference potential; and a switch array exhibiting first and second states in response to a control signal, in said first state said switch array couples said first end of said secondary winding to said output terminal for developing said in-phase RF signal and couples said second end of said secondary winding to a source of reference potential through a first termination impedance and in said second state, said switch array couples said second end of said secondary winding to said output terminal for developing said out-of-phase signal and couples said first end of said secondary winding to a source of reference potential through a second termination impedance;

said switch array having a control terminal for receiving said control signal for controlling which of said in-phase and out-of-phase RF signal is selected;

said biphase modulator including no transformer other than said transformer having said centertap.

2. A low power consumption biphase modulator, comprising:

an input terminal for receiving an input RF signal of a predetermined phase;

an output terminal for developing an RF signal in phase with respect to said input RF signal or substantially 180-degrees out of phase with respect to said input RF signal;

a transformer having a primary winding coupled to said input terminal for receiving said input RF signal, and having a secondary winding including first and second ends and a centertap for developing at opposite ones of said first and second ends said in-phase and out-of-phase RF signals, said centertap being coupled to a point of reference potential; and an FET switch array exhibiting first and second states in response to a control signal, in said first state said FET switch array couples said first end of said secondary winding to said output terminal for developing said in-phase RF signal and couples said second end of said secondary winding to a source of reference potential through a first termination impedance and in said second state, said FET switch array couples said second end of said secondary winding to said output terminal for developing said out-of-phase signal and couples said first end of said secondary winding to a source of reference potential through a second termination impedance;

said FET switch array having a control terminal for receiving said control signal for controlling which of said in-phase and out-of-phase RF signals is selected;

said biphase modulator including no transformer other than said transformer having said centertap.

3. The low power consumption biphase modulator of claim 2 wherein, said FET switch array is a JFET array.

4. The low power consumption biphase modulator of claim 2 wherein, said FET switch array comprises four GaAs JFETs.

5. The low power consumption biphase modulator of claim 2 wherein, said FET switch array comprises four MOSFETs.

6. In direct sequence spread spectrum battery-powered communications equipment, a low power consumption biphase modulator, comprising:

an input terminal for receiving a 900 MHz RF carrier signal of a predetermined phase;

an output terminal for developing an RF signal in phase with respect to said input RF signal or substantially 180-degrees out of phase with respect to said input RF signal;

a transformer having a primary winding coupled to said input terminal for receiving said 900 MHz RF carrier signal, and having a secondary winding including first and second ends and a centertap for developing at opposite ones of said first and second ends said in-phase and out-of-phase RF carrier signals with respect to said centertap, said centertap being coupled to a point of reference potential; and an FET switch array exhibiting first and second states in response to a control signal, in said first state said FET switch array couples said first end of said secondary winding to said output terminal for developing said in-phase RF signal and couples said second end of said secondary winding to a source of reference potential through a first termination impedance and in said second state, said FET switch array couples said second end of said secondary winding to said output terminal for developing said out-of-phase signal and couples said first end of said secondary winding to a source of reference potential through a second termination impedance;

said FET switch array having a control terminal for receiving said control signal for controlling which of said in-phase or out-of-phase carrier signals is selected, said control signal being a combination of a binary representation of speech and a spreading code;

said biphase modulator including no transformer other than said transformer having said centertap.

7. A low power consumption quadraphase modulator, comprising:

an input terminal for receiving an input RF signal of a predetermined phase;

an output terminal for developing an RF signal which is one of in phase with respect to said input RF signal, 90-degrees out-of-phase with respect to said input RF signal, 180-degrees out-of-phase with respect to said input RF signal, and 270-degrees out-of-phase with respect to said input RF signal;

a quadrature phase network for developing first and second RF signals having a 90-degree phase shift between them;

a first transformer having a primary winding coupled to said input terminal for receiving said input RF signal, and having a secondary winding including first and second ends and a centertap for developing at opposite ones of said first and second ends said in-phase and said 180-degree-out-of-phase RF signals, said centertap being coupled to a point of reference potential; and a second transformer having a primary winding coupled to said quadrature phase network for receiving said RF signal having a 90-degree phase shift with respect to said input RF signal, and having a secondary winding including first and second ends and a centertap for developing at opposite ones of said first and second ends said 90-degree out-of-phase and 270-degree out-of-phase RF signals, said centertap being coupled to a point of reference potential; and a first switch array exhibiting first and second states in response to a first control signal, in said first state said first switch array couples said first end of said secondary winding of said first transformer to said output terminal for developing said in-phase RF signal and couples said second end of said secondary winding of said first transformer to a source of reference potential through a first termination impedance, and in said second state said first switch array couples said second end of said secondary winding of said first transformer to said output terminal for developing said 180-degree-out-of-phase signal and couples said first end of said secondary winding of said first transformer to a source of reference potential through a second termination impedance;

a second switch array exhibiting third and fourth states in response to a second control signal, in said third state said second switch array couples said first end of said secondary winding of said second transformer to said output terminal for developing said 90-degree out-of-phase RF signal and couples said second end of said secondary winding of said second transformer to a source of reference potential through a third termination impedance, and in said fourth state said second switch array couples said second end of said secondary winding of said second transformer to said output terminal for developing said 270-degree-out-of-phase signal and couples said first end of said secondary winding of said second transformer to a source of reference potential through a fourth termination impedance;

each of said first and second switch arrays having a control terminal for receiving a respective one of first and second control signals for controlling which of said phases of said RF signal is selected;

said biphase modulator including no output transformer.

* * * * *